United States Patent [19]
Rodek

[11] 3,944,896
[45] Mar. 16, 1976

[54] PHASE SYNCHRONIZATION SYSTEM WITH START-UP SEQUENCING AND AUTOMATIC SHUT-DOWN

[75] Inventor: Victor Rodek, Rochester, N.Y.
[73] Assignee: Xerox Corporation, Stamford, Conn.
[22] Filed: May 8, 1974
[21] Appl. No.: 467,967

[52] U.S. Cl. ................. 318/85; 318/596; 318/619
[51] Int. Cl.² ........................................... H02D 5/50
[58] Field of Search ................. 318/85, 619, 596

[56] References Cited
UNITED STATES PATENTS

| | | | |
|---|---|---|---|
| 3,252,101 | 5/1966 | Gorbatenko | 318/619 X |
| 3,430,148 | 2/1969 | Miki | 318/85 X |
| 3,505,606 | 4/1970 | Werner | 318/619 X |
| 3,611,100 | 10/1971 | McQuowh, Jr. | 318/618 X |
| 3,622,703 | 11/1971 | Ricketts et al. | 318/85 X |
| 3,636,364 | 1/1972 | Stempler et al. | 318/85 X |
| 3,673,422 | 6/1972 | Parke | 318/85 X |
| 3,708,754 | 1/1973 | Diehl | 318/619 X |
| 3,731,176 | 5/1973 | Mitchell et al. | 318/619 |
| 3,757,178 | 9/1973 | Veale | 318/85 X |

*Primary Examiner*—James R. Scott
*Assistant Examiner*—John J. Feldhaus
*Attorney, Agent, or Firm*—John E. Beck; Terry J. Anderson; Irving Keschner

[57] ABSTRACT

A system for providing a predetermined phase relationship between signals representing the operation of first and second moveable members, the operation of said first moveable member being regulated in accordance with the operation of said second moveable member. The phase relationship is determined by comparison means which produces a pulse signal indicative of said phase relationship. Signal storage means, responsive to the pulse signal, produces an analog signal, the amplitude thereof varying at a first rate, the maximum amplitude attained by said analog signal being proportional to said phase relationship. The output of said signal storage means is coupled to signal generating means comprising variable gain means, said variable gain means being adjusted to correspond to a predetermined gain, said signal generating means generating an analog signal proportional to the signal stored by said storage means. Feedback means is controlled by the analog signal to modify the operation of the first moveable member whereby said first moveable member is urged into said predetermined phase relationship with said second moveable member. If the predetermined phase relationship is attained within a predetermined period, control means causes the analog signal produced by said storage means to vary at a second rate different from said first rate, and said variable gain means is adjusted to a gain different from said predetermined gain. If the predetermined phase relationship is not attained within said predetermined period, apparatus incorporating said system is automatically shut down. Upon reactivation of the apparatus, the analog signal produced by said storage means varies at said first rate and said gain means is adjusted to said predetermined gain.

9 Claims, 4 Drawing Figures

PHASE SYNCHRONIZATION SYSTEM WITH START-UP SEQUENCING AND AUTOMATIC SHUT-DOWN

BACKGROUND OF THE INVENTION

Phase synchronization systems for controlling the phase relationship between two signals are disclosed in the prior art and have been adapted for use in those technologies requiring velocity control of a first moveable member in accordance with the velocity of a second moveable member. For example, in copending application Ser. No. 89,869 filed Nov. 16, 1970, an assigned to the assignee of the present invention, a phase synchronization system is disclosed wherein, in a preferred embodiment, the first moveable member comprises a filmstrip and the second moveable member comprises a web having a preprinted format thereon, such as headings, columns and the like. Since the filmstrip and web, when operative, are both continuously moving, phase synchronization therebetween is required such that the information prerecorded on the filmstrip is accurately printed at the appropriate portion of the web. The phase relationship between the signals representing the velocity of the filmstrip and the web is determined by a comparator which produces a pulse width modulated signal indicative of the phase relationship. The pulse width modulated signal is applied to an integrator and thence to a storage means, the output of the storage means being of an amplitude representing the phase error between the aforementioned velocity signals. The output of the storage means is coupled to a control voltage generator, the output thereof causing a motor to adjust the velocity of the first filmstrip such that phase synchronism is attained.

At start-up (when the apparatus incorporating the phase synchronization system described hereinabove is initially operative), the determined phase error may range from a relatively insignificant error to the maximum error possible, i.e., the situation wherein the pulse signal representing the velocity of the member not being controlled is substantially in phase with the second pulse in the pulse sequence representing the velocity of the member being controlled. In the latter situation, the time necessary to attain a predetermined phase relationship becomes a significant factor in decreasing the efficiency and speed of the system operation. Further, during normal operation of the system, the measured phase error may be greater than allowed by system requirements (i.e., the information would be printed in the wrong column). Therefore, it would be desirable to incorporate in the type of system described hereinabove a technique wherein the phase error, at start-up, is rapidly reduced to a predetermined level, the phase error continually being monitored such that the system is shut down if the phase error exceeds said predetermined level.

SUMMARY OF THE PRESENT INVENTION

The present invention provides method and apparatus particularly adapted for use in a phase synchronization system wherein electrical signals representing the velocities of first and second moveable members are adjusted such that a predetermined phase relationship therebetween is attained wherein the velocity of said first moveable member is increased above a nominal value at system start-up and wherein apparatus incorporating the system is automatically shut down if the phase relationship is greater than said predetermined phase relationship.

In particular, method and apparatus is provided for maintaining a predetermined phase relationship between signals representing the operation of first and second moveable members, the operation of said first moveable member being regulated in accordance with the operation of said second moveable member. The phase relationship is determined by comparison means which produces a pulse signal indicative of said phase relationship. Signal storage means, responsive to the pulse signal, produces an analog signal, the amplitude thereof varying at a first rate, the maximum amplitude attained by said analog signal being proportional to said phase relationship. The output of said signal storage means is coupled to signal generating means comprising variable gain means, said variable gain means being adjusted to correspond to a predetermined gain, said signal generating means generating an analog signal proportional to the signal stored by said storage means. Feedback means is controlled by the analog signal to modify the operation of the first moveable member whereby said first moveable member is urged into said predetermined phase relationship with said second moveable member. If the predetermined phase relationship is attained within a predetermined period, control means causes the analog signal produced by said storage means to vary at a second rate different from said first rate, and said variable gain means is adjusted to a gain different from said predetermined gain. If the predetermined phase relationship is not attained within said predetermined period, said apparatus is automatically shut down. Upon reactivation of the system, the analog signal produced by said storage means varies at said first rate and said gain means is adjusted to said predetermined gain.

It is an object of the present invention to provide method and apparatus for causing a phase synchronization system to be operative in either a first or second mode, the first mode occurring at system start-up and the second mode occurring within a predetermined period thereafter.

It is a further object of the present invention to provide method and apparatus for causing a phase synchronization system to be operative in either a first or second mode, the first mode occurring at system start-up and the second mode occurring at a predetermined period thereafter, said system reverting to said first mode of operation if phase synchronization is not attained within said predetermined period.

It is still a further object of the present invention to provide method and apparatus for maintaining a predetermined phase relationship between signals representating the operation of first and second moveable members and wherein said first apparatus is operative in either a first or second mode, said first mode occurring at system start-up and said second mode occurring within a predetermined period thereafter, said apparatus reverting to said first operative mode if said predetermined phase relationship is not attained within said predetermined time period.

DESCRIPTION OF THE DRAWINGS

For a better understanding of the invention, as well as the further features thereof, reference is made to the following description which is to be read in conjunction with the accompanying drawings wherein.

DESCRIPTION OF THE PREFERRED EMBODIMENT

Figure 1:
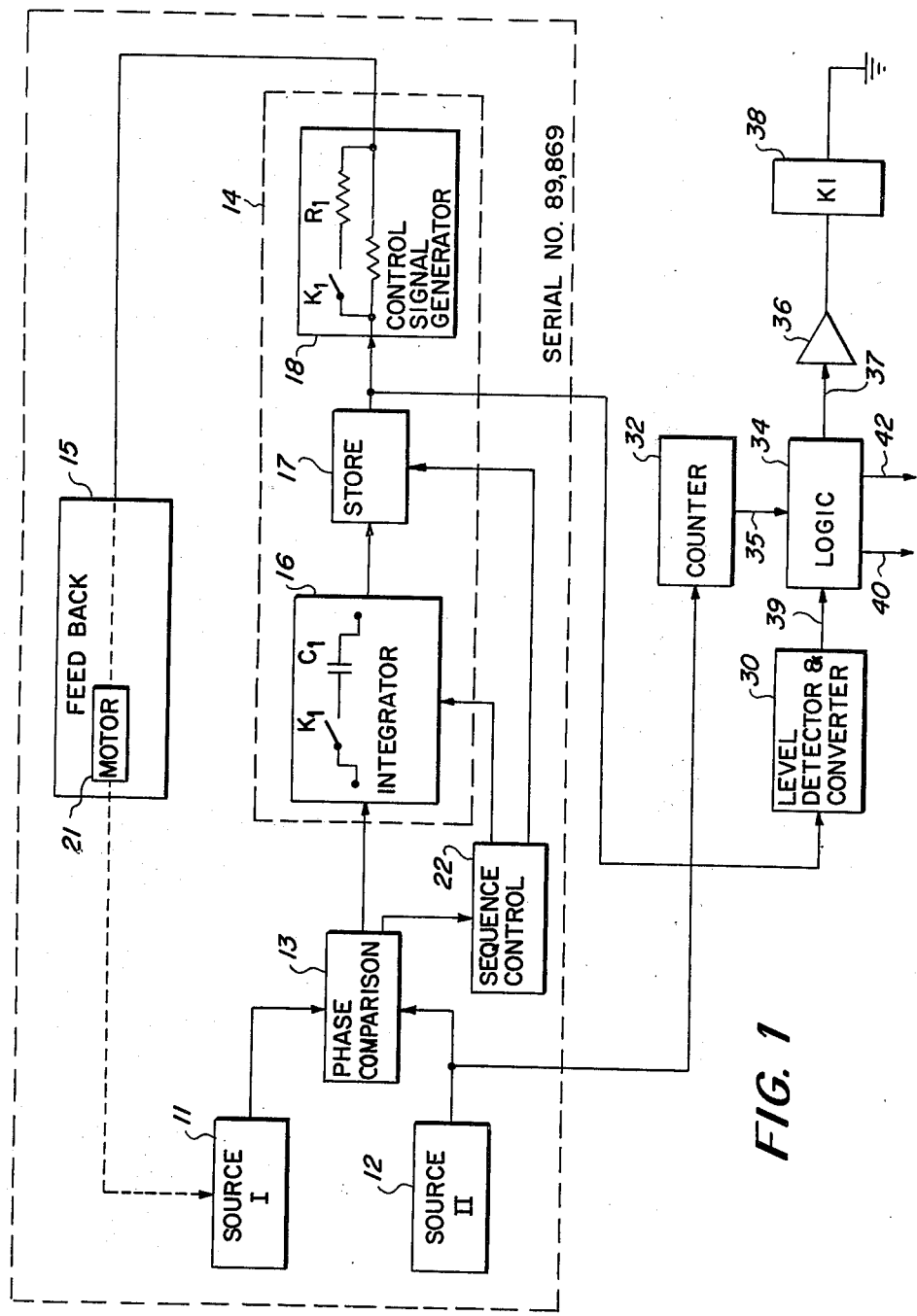
FIG. 1 is a block diagram of the present invention.

Referring now to FIG. 1, a block diagram of the present invention is illustrated. It should be noted at this point that for illustrative purposes the present invention will be described with reference to the phase synchronizing system described in copending U.S. Pat. application Ser. No. 89,869 filed Nov. 16, 1970, and assigned to the assignee of the present invention. As will be ascertained from the description hereinafter, the modifications to the system described in the copending application is easily adapted to alternate phase synchronization systems. For the sake of brevity, the detailed disclosure of the copending application will not be set forth herein. The teachings of the aforementioned copending application are incorporated herein by reference.

FIG. 1 illustrates a block diagram of an embodiment of the synchronizing apparatus of the present invention which comprises first signal producing means 11, second signal producing means 12, phase comparison means 13, control signal generating means 14 and feedback means 15. First signal producing means 11 may comprise a conventional signal generator for providing a signal having a phase characteristic to be controlled. The signal produced by first signal producing means 11 may be indicative of the speed of a first moveable member such as a translating device having a rectilinear velocity. The speed of a moving member may be indicated by providing one or a plurality of marks on said moving member and detecting the passage of said marks through a predetermined position.

Second signal producing means 12 may be similar to first signal producing means 11, the phase characteristic of the signal produced by said second signal producing means 12 acting as a reference for controlling the signal produced by said first signal producing means 11. Phase comparison means 13 is coupled to the first and second signal producing means 11 and 12, respectively, and is adapted to determine the phase relationship between the signals respectively supplied thereto, and to generate signals indicative of said phase relationship. Comparison means 13 may comprise pulse duration modulation means for generating a pulse signal having a time duration proportional to the difference between the phases of the signals supplied thereto.

Control signal generating means 14 is coupled to comparison means 13 and serves to provide a control signal having a magnitude determined by the signals generated by said comparison means 13. Control signal generating means 14 may comprise integrating means 16 coupled to storage means 17 which, in turn, is coupled to a control voltage generator 18. Integrating means 16 preferably includes means to reset the output signal thereof to an initial condition. Storage means 17 is adapted to store the maximum amplitude obtained by the integrated signal provided by integrating means 16.

The control voltage generator 18 coupled to storage means 17 is adapted to provide a control signal and may comprise amplifying means to amplify the signal supplied thereto by storage means 17 to a desired value. In the absence of a stored signal, control voltage generator 18 provides at its output terminal a d.c. voltage of constant amplitude.

Integrating means 16 and storage means 17 are additionally coupled to sequence control means 22 and are supplied with operating control signals therefrom. The operating control signal supplied to integrating means 16 from sequence control means 22 is adapted to reset the integrating means 16 to its initial condition. Further, the operating control signal supplied to storage means 17 serves to enable the storage means 17 to store the maximum amplitude obtained by the integrated signal. Sequence control means 22 may comprise a digital logic circuit that automatically generates operating control signals when comparison means 13 has determined the phase relationship between the signals produced by first and second signal producing means 11 and 12, respectively.

The output of control signal generating means 14 is coupled to feedback means 15, the latter being adapted to modify the operation of the first signal producing means 11 in accordance with the control signal provided by control signal generating means 14. Feedback means 15 may comprise a motor 21 which is coupled to the first signal producing means 11 and serves to alter the operating characteristics of first signal producing means 11 whereby the phase of the signal provided by first signal producing means 11 is altered in accordance with the signal produced by control signal generator 18.

In operation, the velocity of the first moveable member is indicated by signals produced by a first sensing means which senses marks thereon, the frequency of the signals produced by first signal producing means 11 being directly related to the velocity of the first moveable member. The velocity of the second moveable member may be indicated by signals which are produced by second sensing means sensing marks thereon, the frequency of the signals produced by second signal producing means 12 being directly related to the velocity of the second moveable member. The ratio of the spacing between the consecutive marks of the first moveable member to the spacing between the consecutive marks of the second moveable member should be equal to the ratio of the velocity of the first moveable member to the velocity of the second moveable member. Accordingly, the frequencies of the signals applied to comparison means 13 will be equal, notwithstanding the different velocities represented thereby, when the velocity of the first moveable member is synchronized with the velocity of the second moveable member.

If the signals applied to comparison means 13 are pulses, comparison means 13 produces a pulse having a time duration equal to the phase difference between the leading edges of the applied pulses. A pulse having a time duration equal to the phase difference between the generated pulses may then be produced having a polarity depending on whether the signal supplied by the first signal producing means 11 exhibits a phase leading relationship with respect to the signal supplied by the second signal producing means 12 or a second polarity when the signal supplied by the first signal producing means 11 exhibits a phase lagging relationship with respect to the signal supplied by the second signal producing means 12. When the first moveable member is in a desired relationship with respect to the second moveable member, the signals applied to comparison means 13 are in phase and comparison means 13 does not produce a pulse at its output.

The pulse produced by comparison means 13 is applied to integrating means 16, the maximum amplitude obtained by the integrated signal during each integrating cycle being established by the duration of the pulse signal. When the integrated signal obtains its maximum amplitude, sequence control means 22 enables storage means 17 to store said maximum amplitude, the amplitude of the stored signal representing an error signal indicative of the phase relationship between the signals produced by the first and second signal producing means 11 and 12, respectively, and the polarity of the stored signal represents a leading or lagging phase relationship. At a predetermined period of time subsequent to the storing of the integrated signal, sequence control means 22 applies a reset signal to integrating means 16 to reset the integrating means to an initial condition whereby a succeeding integrating cycle may be effected.

The error signal stored by storage means 17 is amplified by control voltage generator 18, and coupled to motor means 21. Control voltage generator 18 includes combining means such as a summing amplifier to combine the error signal with a nominal or threshold voltage corresponding to a medial frequency. Accordingly, the control signal applied to motor 21 will vary about a threshold level in accordance with the error signal stored by storage means 17. When the integrated signal applied to and stored by storage means 17 is zero, i.e., when the signals applied to comparison means 13 are in phase, control voltage generator 18 will supply the motor 21 with a nominal or threshold voltage to drive the moveable member 11 at a velocity corresponding to the threshold voltage while the system maintains phase synchronism.

Figure 2:
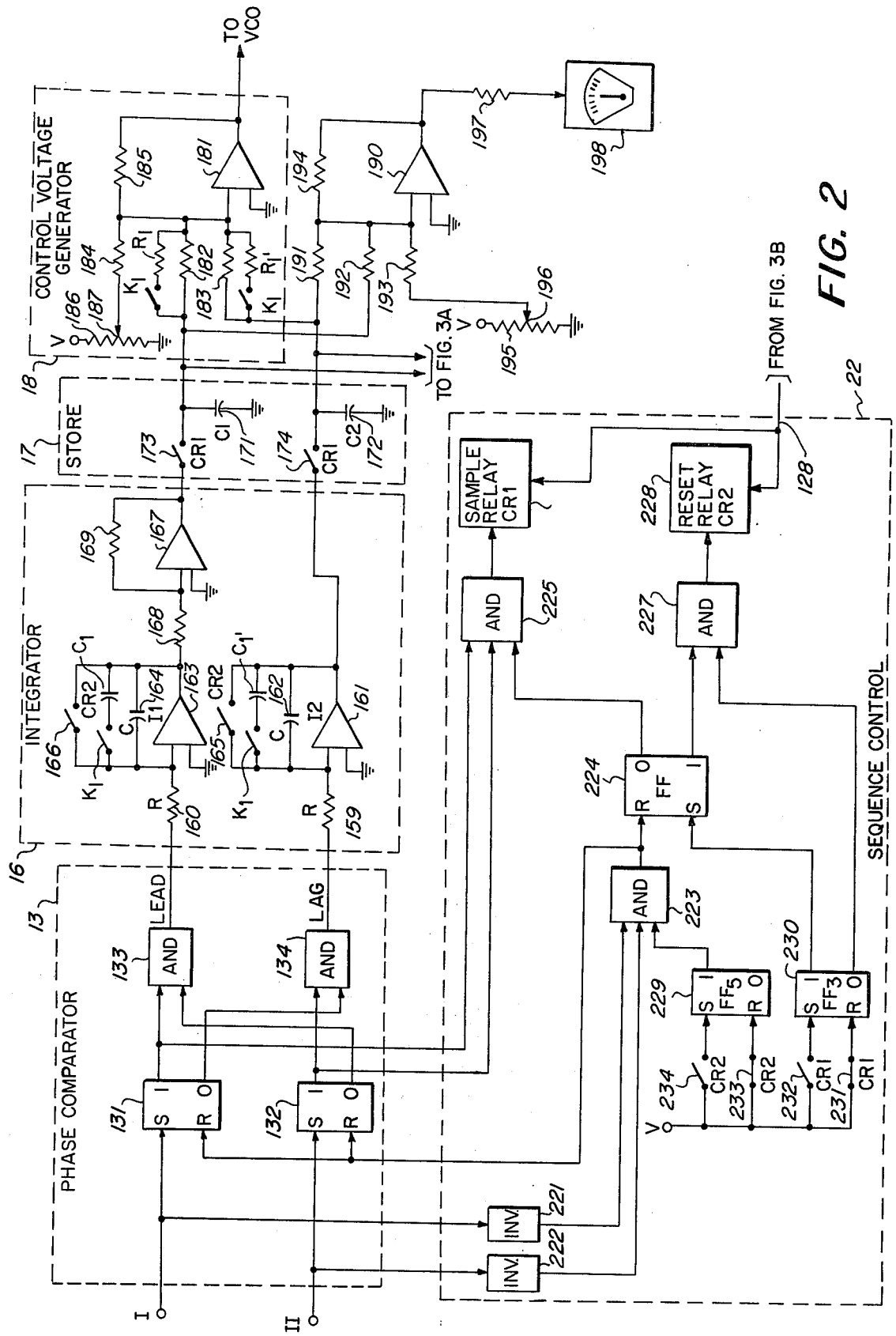
FIG. 2 is a schematic diagram of portions of the block diagram shown in FIG. 1.

FIG. 2 is a schematic diagram of a portion of the apparatus that may be utilized in the embodiment of FIG. 1 and comprises comparison means 13, integrating means 16, storage means 17, control voltage generator 18 and sequence control means 22. Comparison means 13 comprises first and second bistable multivibrators 131 and 132, respectively, and first and second coincidence means 133 and 134, respectively.

Integrating means 16 includes first and second integrating circuits, the first integrating circuit comprising an input resistance means 160, amplifier means 163, capacitance means 164 and switch means 166. Resistance means 160 couples coincidence means 133 to amplifier means 163, and exhibits a resistance of R ohms. Feedback capacitance means 164 couples the output of amplifier means 163 to the input thereof. A switch means 166 is connected in parallel relationship with capacitance means 164. If a pulse signal is applied to resistance means 160, the pulse signal will be integrated by the first integrating circuit, resulting in a ramp signal having a constant slope equal to the product of the amplitude of the pulse signal and the inverse of the time constant of the integrating circuit. At the termination of the pulse signal applied to the resistance means 160, the amplitude obtained by the ramp signal is equal to the product of the slope thereof and the time duration of the applied pulse signal. Hence, the signal at the output of amplifier means 163 is an analog signal representative of the duration of an input pulse signal applied thereto.

The second integrating circuit of integrating means 16 is similar to the just described first integrating circuit and comprises an input resistance means 159, amplifier means 161, capacitance means 162 and switch means 165. Resistance means 159 couples coincidence means 134 to amplifier means 161, the latter being similar to amplifier means 163. Feedback capacitance means 162 couples the output of amplifier means 161 to the input thereof. Switch means 165, which is similar to switch means 166, is connected in parallel relationship with capacitance means 162 and is adapted to discharge capacitance means 162 thereby resetting the second integrating means to an initial state. The second integrating means serves to integrate a pulse signal applied to resistance means 159, resulting in a ramp signal having a constant slope equal to the product of the amplitude of the pulse signal and the inverse of the time constant of the integrating circuit. Upon the termination of the pulse signal applied to resistance means 159, the amplitude obtained by the ramp signal is equal to the product of the slope thereof and the time duration of the applied pulse signal.

A polarity inverting means comprised of amplifier means 167 and resistance means 168 and 169 is provided to invert the signal produced by amplifier means 163.

Storage means 17 comprises a first grounded capacitance means 171 selectively coupled to the amplifier means 167 by switch means 173 and a second grounded capacitance means 172 selectively coupled to amplifier means 161 by switch means 174. Switch means 173 is adapted to be closed for a sufficient period of time to enable grounded capacitance means 171 to charge to the level of the inverted analog signal appearing at the output of amplifier means 167; and switch means 174 is adapted to be closed for a sufficient period of time to enable grounded capacitance means 172 to charge to the level of the analog signal appearing at the output of amplifier means 161. High input impedance amplifiers may be connected at the output of capacitance means 171 and 172 so that the capacitance means are not discharged during a controlling period.

Control voltage generator 18 comprises amplifier means 181, resistance means 182-185 and adjustable resistance means 186. Resistance means 182 couples grounded capacitance means 171 to amplifier means 181, resistance means 183 couples grounded capacitance means 172 to amplifier means 181 and resistance means 184 couples adjustable resistance means 186 to amplifier means 181. In addition, resistance means 185 is a feedback resistor interconnecting the output of amplifier means 181 to the input thereof. Adjustable resistance means 186 is adapted to be provided with a constant supply voltage V and may comprise a potentiometer having an adjustable contact 187. Hence, the magnitude of the voltage applied to resistance means 184 is dependent upon the position of adjustable contact 187. In the illustrated configuration, amplifier means 181 serves to algebraically combine the signals applied to each of resistance means 182, 183 and 184.

The sequence control means 22 is described on Pages 19–21 of the copending application and will not be set forth for the sake of brevity, and the details of the operation of the apparatus shown in FIG. 2 are described on Pages 21–31 of the copending application and will not be repeated hereat.

In accordance with the teachings of the present invention, the system described in the aforementioned copending application (and illustrated in FIGS. 1 and 2) is modified in the following manner. A circuit comprising the series connection of relay contact K1 and capacitor C1 (FIG. 2) is connected in parallel across integrating capacitor 164 and the circuit comprising the series connection of relay contact K1 and capacitor C1' is connected in parallel across integrating capacitor 162. In a similar manner, a circuit comprising the series connection of contact K1 and resistor R1 is connected in parallel across control voltage generator resistor 182 and a circuit comprising the series connection of contact K1 and resistor R1' is connected in parallel across control voltage generator resistor 183. As will be set forth in more detail hereinafter, the addition of capacitors C1 and C1' and the resistors R1 and R1' provides the system with the capability of varying the integration time constant and the gain of amplifier 181, respectively. The remaining modifications to the circuit set forth in the copending application may be seen by reference to the block diagram of FIG. 1. The output of store 17 is coupled to the input of level detector and converter 30, which operates to generate a shaped signal pulse if the amplitude of the stored signal is equal to or greater than a predetermined level. The output of source 12, which is a preferred embodiment comprises a series of pulses corresponding to the marks sensed on the web (and the number of film frames) is coupled to the input of a digital counter 32. The output of digital counter 32 is coupled to digital logic means 34, set forth in detail hereinafter with reference to the description of FIGS. 3(a) and 3(b). The output of digital logic means 34 is coupled to amplifier 36, the output therof being coupled to relay K1, relay K1 controlling relay contacts K1 in the well known manner. The output appearing on leads 40 and 42 resets the integrator 16 and store 17 and causes the system incorporating the synchronizing apparatus to shut down, respectively.

Figure 3A:
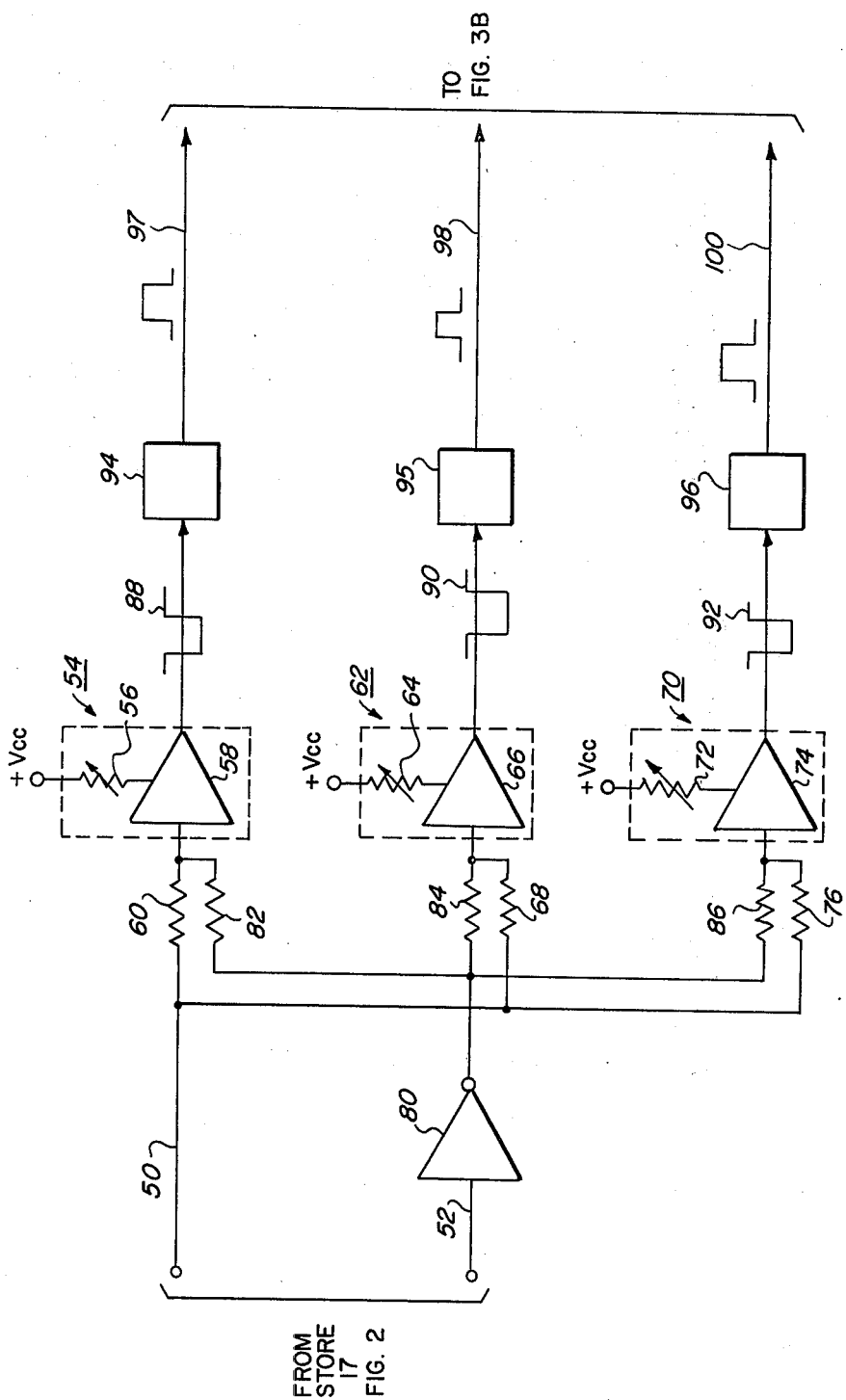
FIGS. 3(a) and 3(b) are schematic diagrams of other portions of the block diagram shown in FIG. 1.
Figure 3B:
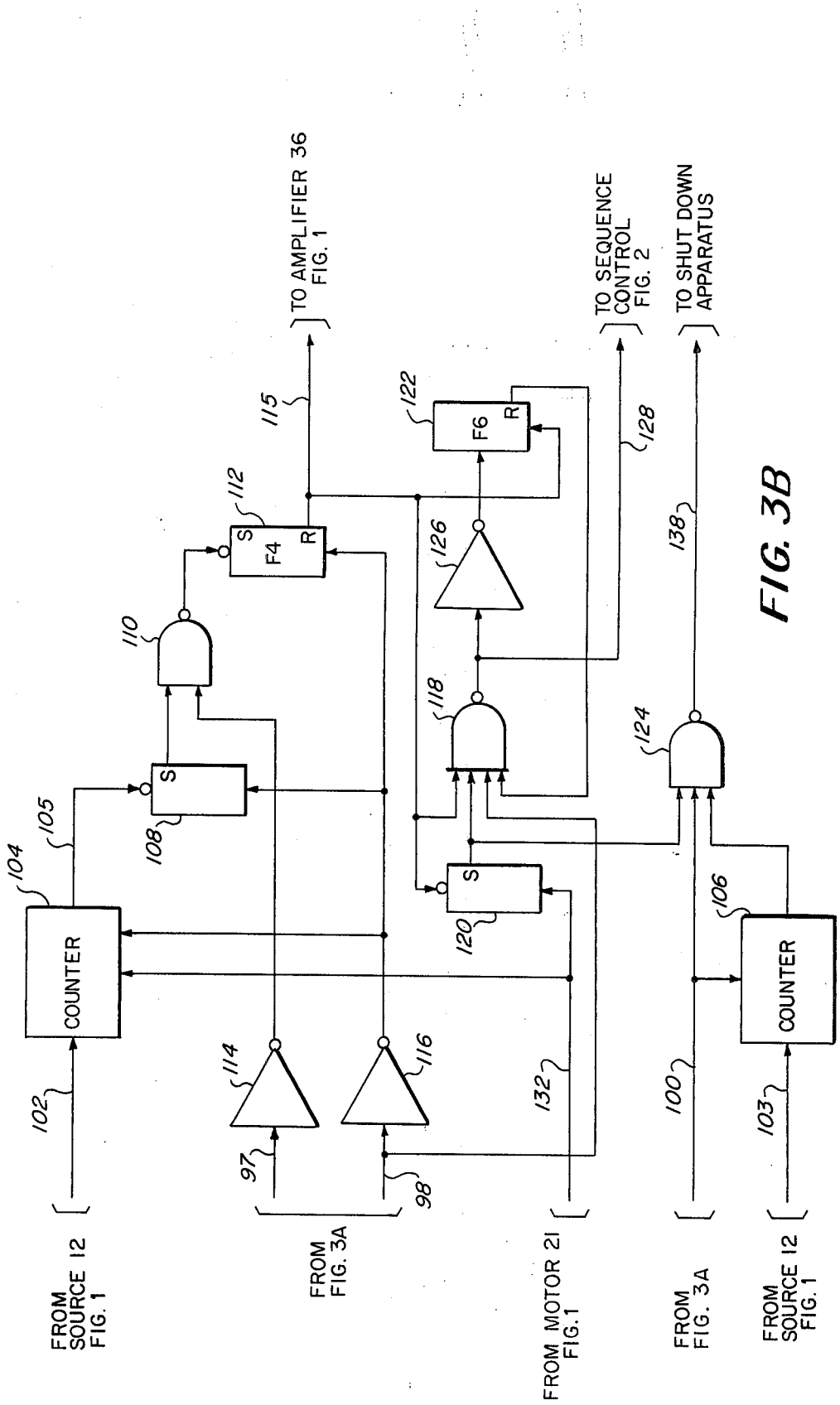

In operation, relay 38 is energized at system start-up, thereby closing the K1 contacts. This allows large filmstrip velocity changes to occur during the start-up period while still maintaining the correct control signal levels with respect to the phase errors detected. In particular, the time constant of the integrator circuits are increased while the gain of the control signal amplifier 181 is also increased. Therefore, at start-up, the phase comparison error applied to the input of the integrator 16 is integrated in a manner whereby the output thereof increases at a slower rate than would occur if contact K1 was open (i.e., the normal, or run, mode of operation). The output of store 17 is then coupled to a level converter 30 which converts the stored output to a pulse if the amplitude of the stored output is greater than a predetermined amount. The output of source 12 which corresponds to the pulses generated by the web sensor is coupled to counter 32. Counter 32 is arranged such that a pulse signal is generated at its output after a predetermined number of pulses are generated by source 12. For example, counter 32 may be arranged such that an output is generated on lead 35 when four pulses are counted thereby. Logic means 34, as will be set forth in more detail hereinafter with reference to FIGS. 3(a) and 3(b), is operative to inhibit a signal level from appearing on lead 37, thereby deenergizing relay K1, if a signal level does not appear on output lead 39 concurrently with the appearance of a signal level on lead 35. The phase synchronization apparatus is, at this point, automatically switched to the normal (run) mode of operation.

If a phase error exceeds a predetermined level, an output signal appears on lead 39. If this signal remains for four web pulses (signal on lead 35), a signal is generated on leads 40 and 42, which clear the integrator 16 and store 17 and causes the system incorporating the phase synchronization apparatus to shut down, respectively. When the system is energized, the phase synchronization apparatus reverts to the start mode described previously.

Referring now to FIGS. 3(a) and 3(b), a schematic diagram of the logic utilized to implement the improvement described hereinabove is illustrated.

The signals appearing on leads 50 and 52 correspond to the voltage levels stored by capacitors 171 and 172 (FIG. 2), respectively. The signal on lead 50 is coupled to level detector 54 comprising an adjustable resistor 56 and operational amplifier 58, via resistor 60. The output on lead 50 is also coupled to level detector 62 comprising adjustable resistor 64 and operational amplifier 66 via resistor 68 and coupled to level detector 70 comprising adjustable resistor 72 and operational amplifier 74 via resistor 76. The output on lead 52 is inverted by inverting amplifier 80 and coupled to the inputs of level detectors 54, 62 and 70 via resistors 82, 84 and 86, respectively. Level detectors 54, 62 and 70 are adjustable such that a negative output pulse is generated only if the input thereto is greater than a predetermined value. In the figure, it has been assumed that the output signal appearing on lead 50 or 52 is greater than the predetermined value, the output of level detectors 54, 62 and 70 therefore are negative pulses 88, 90 and 92, respectively. Negative pulses 88, 90 and 92 are applied to level converters 94, 95 and 96, respectively, which invert the negative pulse applied thereto and also converts the d.c. level thereof such that it is compatible with the following digital circuitry. The outputs of the level converters 94, 95 and 96 appear on output leads 97, 98 and 100, respectively.

The outputs appearing on leads 97, 98 and 100 are applied to the logic circuitry shown in FIG. 3(b) as will be set forth hereinafter. The pulsed output from source 12, corresponding to the marks sensed on the paper web, is applied via lead 102 and 103 to counters 104 and 106, respectively. The output of counter 104 is coupled to the drive input of flip-flop 108, the set output thereof being coupled to one input of NAND gate 110. The output of NAND gate 110 is coupled to the drive input of flip-flop 112. The signal on lead 97, corresponding to the output of level converter 94, is coupled to the input of inverter gate 114, the output thereof being coupled to the other input of NAND gate 110. The input on lead 98, corresponding to the output of level converter 95, is coupled to the input of inverter 116 and also to one input of NAND gate 118. The output of inverter 116 is coupled to the clear input of counter 104 and to the reset inputs of flip-flops 108 and flip-flop 112. The reset output of flip-flop 112 is coupled to the set input of flip-flop 120, a second input of NAND gate 118 and to the reset input of flip-flop 122. The set output of flip-flop 120 is coupled to another input of NAND gate 118 and to one input of NAND gate 124. The output of NAND gate 118 is coupled to the input of inverter gate 126, the output thereof being coupled to the input of flip-flop 122. The reset output of flip-flop 122 is coupled to the input of NAND gate 118. The output from NAND gate 118 on lead 128 (corresponding to lead 40 of FIG. 1) is coupled to reset relay CR2 in FIG. 2. The signal appearing on lead 132 may be supplied by a tachometer coupled to the shaft of the motor 21 such that when the velocity of the filmstrip is reduced to zero, counter 104 will be cleared and flip-flop 120 reset. This signal on lead 100 is coupled to the other input of NAND gate 124. The signal on lead 103 drives counter 106, the output thereof being coupled to the other input of NAND gate 124. The signal on lead 100 clears counter 106. The output of NAND gate 124, appearing on lead 138 (corresponding to lead 42 of FIG. 1), is coupled to circuitry which will automatically shut down the system which incorporates the phase synchronizing apparatus described hereinabove.

In operation, the signal appearing on lead 50 (assuming for illustrative purposes that a phase lead situation is present, it being noted that the operative description for a phase lag situation would be essentially identical) is coupled to level detectors 54, 62 and 70 as described hereinabove. The level detectors can be set to detect any level greater than 0 volts and less than +Vcc. In the preferred mode of operation, +Vcc is 15 volts. The adjustable contact on each level detector potentiometer provides the variable level control. When the output level on lead 50 is greater than the level set by the potentiometer contact, negative output pulses 88, 90 and 92 are generated.

Level converters 94, 95 and 96 modify the level of the aforementioned pulses such that inverted pulses at a different d.c. level are produced. Level converters and level detectors are well known in the art and will not be set forth hereat. The signals appearing on leads 97, 98 and 100 are coupled to the circuitry shown in FIG. 3(b). Flip-flop 112 is initially set when the start-up mode is initiated such that the output on lead 115 is initially high (or logic 1). In this condition, the KR1 relay is energized and the associated contacts are closed such that capacitor C1 and resistor R1 (FIG. 2) are inserted into the synchronizing circuit. When the system is energized, counter 104 is arranged to generate an output on lead 105 after counting a predetermined number of input pulses on lead 102, for example, two web pulses. Therefore, when the second web pulse is detected, flip-flop 108 is set and one input of NAND gate 110 is enabled. When the system is in phase synchronization (i.e., a predetermined phase relationship is attained), the signal on lead 50 is low, the corresponding signal on lead 97 also being low. The output of inverter 114 is high and the output of NAND gate 110, initially high, is changed to a logic 0, thereby setting flip-flop 112. Therefore, the signal on lead 115 is changed to a logic 0, deenergizing the K1 relay and allowing the system to operate in the normal (run) mode.

The logic 0 output pulse on lead 115 sets flip-flop 120 which enables NAND gate 118 and NAND gate 124, flip-flop 120 remaining in the set condition until cleared by a signal appearing on lead 132.

When the phase error exceeds the predetermined level, the signals on leads 97 and 98 are high (logic 1) which clears counter 104, resets flip-flops 108 and 112 and the system returns to the initial, or start, mode of operation. In this mode, gate 118 is low and the low signal on lead 128 resets the integrator and sample hold circuits 16 and 17, respectively. In particular, the signal on lead 128 is coupled to sample relay CR1 and reset relay CR2 shown in FIG. 2, whereby CR2 clears integrators 161 and 163 via contacts 165 and 166, respectively, capacitance means 171 and 172 assuming the cleared integrator levels (0 level) via contacts 173 and 174, respectively. At this point, the signals on leads 97 and 98 are low, flip-flop 122 is set, thereby inhibiting NAND gate 118 which removes the integrator and sample clear signals by inhibiting the signal on lead 128. When the signals on leads 97 and 98 are low (flip-flop 122 being cleared), the system reverts to the normal (run) mode of operation.

When the phase error exceeds the predetermined level, a signal is generated on the output of lead 100. Counter 106 is arranged to generate an output when a predetermined number of web pulses on lead 103 are generated. In the preferred embodiment, the counter 106 is set such that an output is generated when four web pulses are counted. With the output of the counter 106 high, a signal appearing on lead 100 (indicating that phase error exceeds the predetermined level) and flip-flop 120 set, the output of lead 138 is low which causes the system incorporating the phase synchronization apparatus to shut down. In a forced shutdown, both the filmstrip motor 21 and the processor drive (not shown) would be deenergized. Preferably, it would be desirable if the processor cycles out existing good copies prior to shutdown and for the filmstrip transport to automatically backspace a predetermined number of frames whereby usable copies can be produced upon restart.

As set forth hereinabove, when the system is in the start mode, the integrator time constants and the gain of the signal amplifier are high in order to achieve phase synchronization from start-up within a small number of filmstrip or web frames by allowing large filmstrip speed changes without modifying the phase error signal measured. When phase synchronization is achieved, the system automatically switches to the normal (run) mode condition. In the run (or normal) mode of operation, the time constants and gains are reduced to a predetermined nominal value.

While the invention has been described with reference to its preferred embodiments, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. In apparatus for synchronizing the velocity of first and second movable members including driving means mechanically coupled to said first movable member, first and second detecting means for deriving first and second signals representative of the velocities of said first and second movable members, respectively, comparison means coupled to said first and second detecting means for determining the phase relationship between said first and second signals, storage means coupled to the output of said comparison means for providing an output, the amplitude of which is proportional to said determined phase relationship, a control signal generating means coupled to said storage means, said control signal generating means comprising a summing amplifier, and feedback means coupling the output of said control signal generating means to said driving means, said feedback means adjusting the speed of said driving means in accordance with the output of said control signal generating means, the improvement comprising:

a summing amplifier having variable gain means, means for adjusting the gain of said variable gain means to a first value when said synchronizing apparatus is initially energized, means for measuring said storage means output and generating an output signal if said storage means output is greater than a predetermined level, first means coupled to the output of said measuring means for adjusting the gain of said variable gain means to a second value if an output signal is not generated by said measuring means, and second means coupled to the output of said measuring means for reducing the velocity of said driving means to substantially zero if an output signal is generated by said measuring means.

2. The apparatus as defined in claim 1 further including integrator means interposed between said comparison means and said storage means, said integrator means comprising means for providing a variable integrating time constant, the time constant of said integrator means being set to a first value when said synchronizing apparatus is initially energized.

3. The apparatus as defined in claim 2 further including means for adjusting said integrating time constant to a second value if an output signal is not generated by said measuring means.

4. The apparatus as defined in claim 3 wherein said providing means comprises a plurality of capacitors and said variable gain means comprises a plurality of input resistors.

5. The apparatus as defined in claim 1 further including means for reducing the velocity of said driving means to substantially zero if an output signal is generated by said measuring means for a predetermined time period after the synchronizing apparatus is initially energized.

6. A method for synchronizing the velocity of first and second movable members comprising the steps of:
driving said first movable member,
deriving first and second signals representative of the velocities of said first and second movable members, respectively,
determining the phase relationship between said first and second signals and producing a signal representative thereof,
storing the signal representing said determined phase relationship,
coupling said stored signal to a control signal generator comprising a summing amplifier having variable gain means, said control signal generator generating a signal which is effective to drive said first movable member,
the speed of said first movable member being adjusted in accordance with said drive signal,
adjusting the gain of said variable gain means to a first value when said synchronizing apparatus is first energized,
measuring said stored signal and generating an output signal if said stored signal is greater than a predetermined level,
adjusting the gain of said variable gain means to a second value if said output signal is not generated, and
reducing the velocity of said first movable member to substantially zero if said output signal is generated.

7. The method as defined in claim 6 wherein the velocity of said first movable member is reduced to substantially zero if said output signal is generated for a predetermined time period after the synchronizing apparatus is initially energized.

8. The apparatus as defined in claim 3 wherein the gain of said variable gain means and the time constant of said integrator means are simultaneously adjusted to said second values if an output signal is not generated by said measuring means.

9. The apparatus as defined in claim 8 wherein the second value of said gain is greater than the first value thereof and the value of said second time constant is greater than the first value thereof.

* * * * *